(12) United States Patent
Sugie

(10) Patent No.: US 12,348,226 B2
(45) Date of Patent: Jul. 1, 2025

(54) TIMER CIRCUIT

(71) Applicant: ROHM CO., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 91 days.

(21) Appl. No.: 18/331,495

(22) Filed: Jun. 8, 2023

(65) Prior Publication Data

US 2023/0421140 A1     Dec. 28, 2023

(30) Foreign Application Priority Data

Jun. 24, 2022   (JP) .................. 2022-102126

(51) Int. Cl.
| | | |
|---|---|---|
| *H03K 3/03* | (2006.01) | |
| *H03K 3/011* | (2006.01) | |
| *H03K 19/0185* | (2006.01) | |

(52) U.S. Cl.
CPC ........... *H03K 3/0307* (2013.01); *H03K 3/011* (2013.01); *H03K 19/018521* (2013.01)

(58) Field of Classification Search
CPC .................. H03K 3/0307; H03K 3/011; H03K 19/018521; H03K 3/355; H03K 17/007; H03K 17/6872; H03K 17/687; H03K 17/6871; H03K 2005/00202; H03B 2200/0038; H03H 11/26

See application file for complete search history.

(56) References Cited

U.S. PATENT DOCUMENTS

| | | |
|---|---|---|
| 2008/0290955 A1 | 11/2008 | Fort et al. |
| 2010/0201454 A1 | 8/2010 | Chen |
| 2012/0235733 A1* | 9/2012 | Nakamoto ............. G01R 21/14 327/541 |

FOREIGN PATENT DOCUMENTS

| | | |
|---|---|---|
| EP | 1693960 A1 | 8/2006 |
| JP | 2003085972 A | 3/2003 |

OTHER PUBLICATIONS

DE Office Action for corresponding DE Application No. 102023116552.6; Issued on Jun. 4, 2024; 10 pages.

* cited by examiner

*Primary Examiner* — Jung Kim

(74) *Attorney, Agent, or Firm* — CANTOR COLBURN LLP

(57) ABSTRACT

A first current source charges a capacitor. A second current source supplies a current to an input node of an inverter. A current mirror circuit has its output node coupled to an input node of the inverter. A resistor is coupled between the input node of the current mirror circuit and the capacitor.

9 Claims, 11 Drawing Sheets

TIMER CIRCUIT

CROSS REFERENCE TO RELATED APPLICATIONS

The present invention claims priority under 35 U.S.C. § 119 to Japanese Application, 2022-102126, filed on Jun. 24, 2022, the entire contents of which being incorporated herein by reference.

BACKGROUND

1. Technical Field

The present disclosure relates to a timer circuit.

2. Description of the Related Art

In a semiconductor integrated circuit, a timer circuit for time measurement is employed. The timer circuit includes a capacitor, a current source that charges the capacitor, and a voltage comparator that compares the voltage across the capacitor with a predetermined threshold voltage.

In a case in which an operational amplifier including a differential amplifier is employed as a voltage comparator, this leads to an increased circuit scale and increased power consumption. In applications that require a small area and low power consumption, an inverter is employed as such a voltage comparator.

In a case in which an inverter is employed as a voltage comparator, the threshold voltage thereof is the midpoint voltage of the power supply voltage of the inverter. Accordingly, change in the power supply voltage leads to a change in the threshold voltage. In a case in which such a voltage comparator is employed as an oscillator, such an arrangement has a problem in that, when the power supply voltage decreases, the oscillation frequency increases.

SUMMARY

The present disclosure has been made in order to solve such a problem.

An embodiment of the present disclosure relates to a timer circuit. The timer circuit includes: a capacitor; a first current source structured to charge the capacitor; an inverter; a second current source structured to supply a current to an input node of the inverter; a current mirror circuit having an output node coupled to the input node of the inverter; and a resistor coupled between an input node of the current mirror circuit and the capacitor.

It should be noted that any combination of the components described above, or any manifestation of the components may be mutually substituted between a method, apparatus, system, and so forth, which are also effective as an embodiment of the present invention or the present disclosure. The description of the items (means for solving the problems) is by no means intended to describe all the indispensable features of the present invention. That is to say, any sub-combination of the features as described above is also encompassed in the technical scope of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Figure 1:
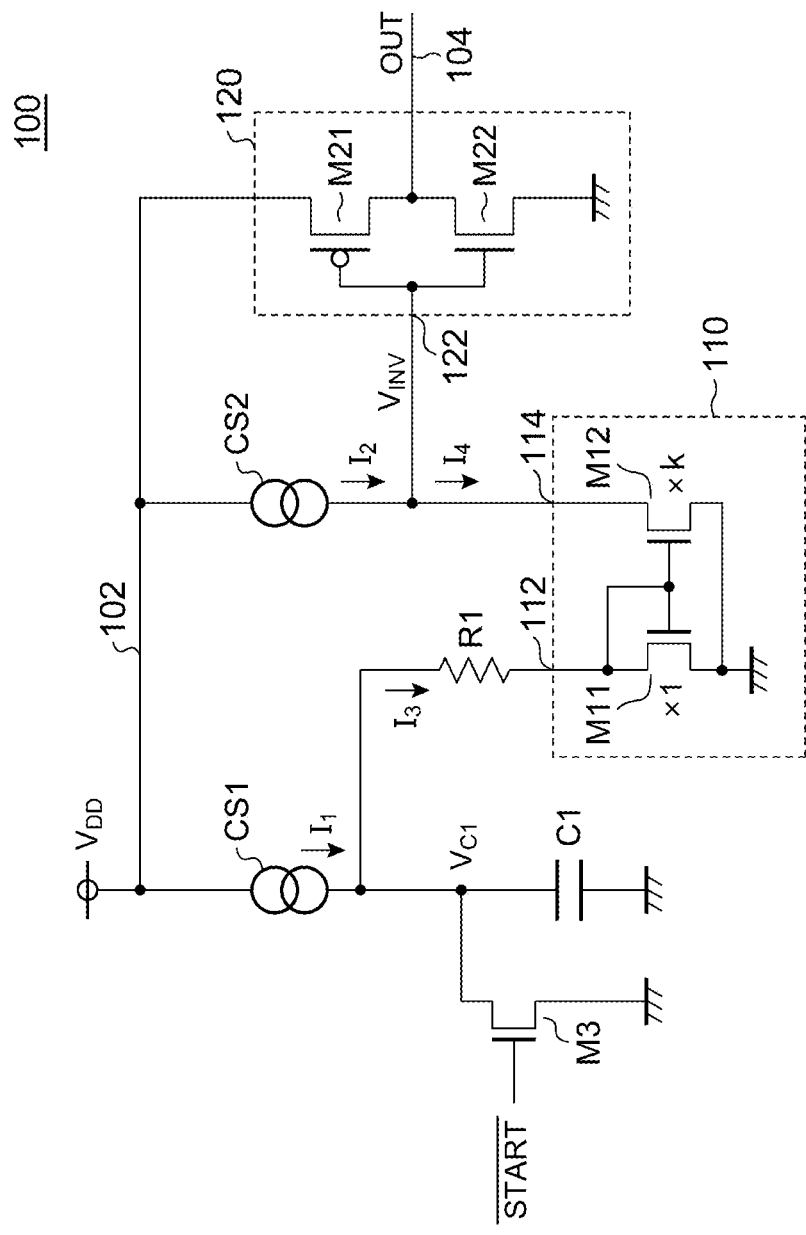
FIG. 1 is a circuit diagram of a timer circuit according to an embodiment.

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

A timer circuit according to one embodiment includes: a capacitor; a first current source structured to charge the capacitor; an inverter; a second current source structured to supply a current to an input node of the inverter; a current mirror circuit having an output node coupled to the input node of the inverter; and a resistor coupled between an input node of the current mirror circuit and the capacitor. With the voltage across the capacitor as $V_{C1}$, with the threshold voltage of the input-side transistor of the current mirror circuit as $V_{TH}$, and with the resistance value of the resistor as R1, the current $I_3$ that flows through the resistor and the input node of the current mirror circuit is represented by $I_3=(V_{C1}-V_{TH})/R1$. With the mirror ratio of the current mirror circuit as K, the output current $I_4$ of the current mirror circuit is represented by $I_4=K \times I_3=K \times (V_{C1}-V_{TH})/R1$. When the current $I_2$ generated by the second current source becomes equal to the output current $I_4$ of the current mirror circuit, the output of the inverter changes. Accordingly, the capacitor voltage $V_{C1(TH)}$ at the point when the output of the inverter changes is represented by $V_{C1(TH)}=I_2 \times R1/K+V_{TH}$. The voltage $V_{C1(TH)}$ is a constant value that does not depend on the power supply voltage of the inverter. Accordingly, with such a timer circuit, this is capable of providing time measurement without depending on the power supply voltage.

In one embodiment, the current mirror circuit may be configured using a field-effect transistor (FET).

In one embodiment, the ratio between the channel width W and the channel length L, i.e., W/L, is determined such that, when the output of the inverter changes, a fluctuation of the gate-source voltage of an input-side transistor of the current mirror circuit is maintained within a range of 0.1 V or less or more preferably, 0.05 or less in a case in which a fluctuation occurs in the temperature within a guaranteed operating temperature range. This is capable of reducing the temperature dependence of the measurement time.

In one embodiment, the current mirror circuit may be configured using a bipolar transistor.

In one embodiment, the timer circuit may be monolithically integrated on a single semiconductor substrate. Examples of such an "integrated" arrangement include: an arrangement in which all the circuit components are formed on a semiconductor substrate; and an arrangement in which principal circuit components are monolithically integrated. Also, a part of the circuit components such as resistors or capacitors may be arranged in the form of components external to such a semiconductor substrate in order to adjust the circuit constants. By integrating the circuit on a single chip, such an arrangement allows the circuit area to be reduced and allows the circuit elements to have uniform characteristics.

An oscillator according to one embodiment may include: any one of the timer circuits described above; and a reset circuit structured to discharge the capacitor in response to the output of the inverter of the timer circuit.

An oscillator according to one embodiment may include two timer circuit. Each of the two timer circuits may be reset by an output of the other timer circuit.

A semiconductor apparatus according to one embodiment may include any one of the oscillator circuits described above, a charge pump circuit driven by an output signal of the oscillator circuit, and an N-type transistor arranged such that the output voltage of the charge pump circuit is received via its control electrode.

Embodiments

Description will be made below regarding preferred embodiments with reference to the drawings. The same or similar components, members, and processes are denoted by the same reference numerals, and redundant description thereof will be omitted as appropriate. The embodiments have been described for exemplary purposes only and are by no means intended to restrict the present disclosure and the present invention. Also, it is not necessarily essential for the present disclosure and the present invention that all the features or a combination thereof be provided as described in the embodiments.

In some cases, the sizes (thickness, length, width, and the like) of each component shown in the drawings are expanded or reduced as appropriate for ease of understanding. The size relation between multiple components in the drawings does not necessarily match the actual size relation between them. That is to say, even in a case in which a given member A has a thickness that is larger than that of another member B in the drawings, in some cases, in actuality, the member A has a thickness that is smaller than that of the member B.

In the present specification, a state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, a state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

In the present specification, the reference symbols denoting electric signals such as a voltage signal, current signal, or the like, and the reference symbols denoting circuit elements such as a resistor, capacitor, inductor, or the like, also represent the corresponding voltage value, current value, or circuit constants (resistance value, capacitance value, inductance) as necessary.

FIG. 1 is a circuit diagram of a timer circuit 100 according to an embodiment. After a predetermined time (measurement time) $\tau_{MEAS}$ has elapsed after a start signal /START ("/" represents logical inversion) is asserted (is set to low, for example), the timer circuit 100 asserts (sets to high, for example) a signal OUT output from an output terminal (output line) 104.

The timer circuit 100 includes a capacitor C1, a first current source CS1, a second current source CS2, a current mirror circuit 110, a resistor R1, an inverter 120, and a reset transistor M3. A power supply voltage $V_{DD}$ is supplied to a power supply line 102 of the timer circuit 100.

The capacitor C1 is arranged such that one end is grounded. The first current source CS1 is coupled to the other end of the capacitor C1. The first current source CS1 functions as a source of a constant current $I_1$ to the capacitor C1 so as to charge the capacitor C1.

The inverter 120 includes a high-side transistor M21 and a low-side transistor M22 coupled between the power supply line 102 and the ground. Specifically, the high-side transistor M21 is coupled between the power supply line 102 and the output line 104. The low-side transistor M22 is coupled between the output line 104 and the ground.

The second current source CS2 is coupled to an input node 122 of the inverter 120. The second current source CS2 functions as a source of a current $I_2$ to the input node of the inverter 120.

The current mirror circuit 110 mirrors the current that flows through the input node 112 such that it is multiplied by K ("K" is referred to as the mirror ratio), and such that the mirrored current is folded back and sunk from an output node 114. The current mirror circuit 110 includes an input-side transistor M11 and an output-side transistor M12. The output node 114 of the current mirror circuit 110 is coupled to the input node 122 of the inverter 120.

The resistor R1 is coupled between the input node 112 of the current mirror circuit 110 and the capacitor C1.

The reset transistor M3 is coupled in parallel with the capacitor C1. During a period in which the start signal /START is negated (high), the reset transistor M3 is turned on so as to discharge the capacitor C1. During a period in which the start signal /START is asserted (low), the reset transistor M3 is turned off, which allows the capacitor C1 to be charged by means of the first current source CS1.

The above is the configuration of the timer circuit 100. Next, description will be made regarding the operation thereof.

Figure 2:
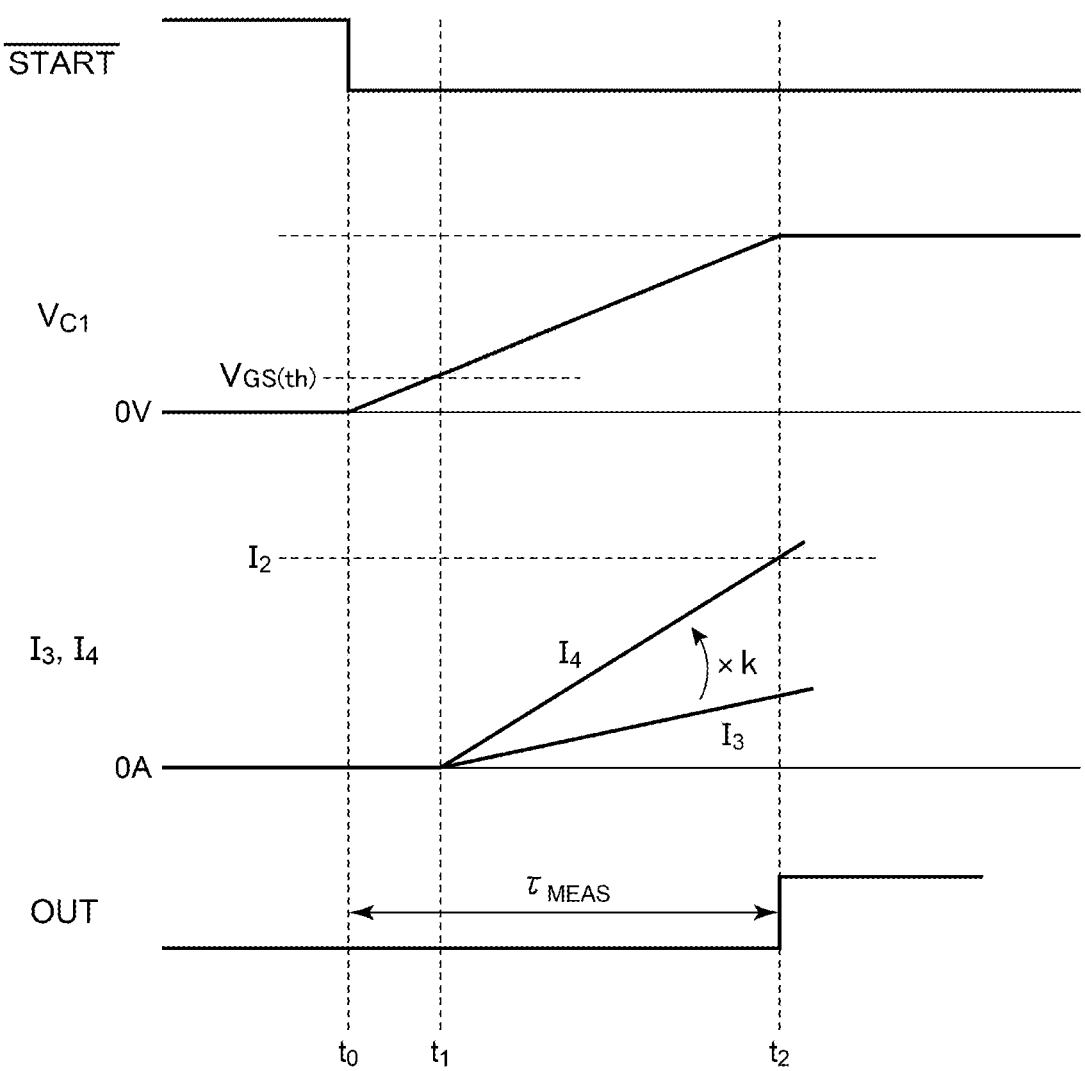
FIG. 2 is an operation waveform diagram of the timer circuit shown in FIG. 1.

FIG. 2 is an operation waveform diagram of the timer circuit 100 shown in FIG. 1. FIG. 2 shows the start signal /START, the voltage $V_{C1}$ across the capacitor C1, the current $I_3$ that flows through the resistor R1, the output current $I_4$ of the current mirror circuit 110, and the output signal OUT.

Before the time point $t_0$, the start signal /START is negated, and the reset transistor M3 is turned on. In this state, the capacitor voltage $V_{C1}$ is fixed to 0 V.

When the start signal /START is asserted at the time point $t_0$, the capacitor C1 is charged by the current $I_1$ generated by the first current source CS1. With this, the capacitor voltage $V_{C1}$ rises with time.

When the capacitor voltage $V_{C1}$ exceeds a gate-source threshold voltage $V_{GS(th)}$ of the input-side transistor M11 of the current mirror circuit 110, the current $I_3$ starts to flow through the resistor R1 and the input side of the current mirror circuit 110. The current $I_3$ is represented by the following Expression.

$$I_3 = (V_{C1} - V_{GS(th)})/R1$$

For simplification of description, FIG. 2 shows an example in which the current $I_3$ is zero during a period of $t_0$ to $t_1$, but an arrangement may be made in which a current $I_3$ actually flows. The current $I_4$ obtained by multiplying the input current $I_3$ by K flows through the output node 114 of the current mirror circuit 110. For simplification of description, FIG. 2 shows an example in which the capacitor voltage $V_{C1}$ and the current $I_3$ each rise with a constant slope. However, in actuality, the capacitor voltage $V_{C1}$ is charged by the difference between the currents $I_1$ and $I_3$. Accordingly, the rising slope of the capacitor voltage $V_{C1}$ is not linear.

Before the time point $t_2$, the relation $I_4 < I_2$ holds true. Accordingly, the voltage $V_{INV}$ of the input node 122 of the inverter 120 is high ($V_{DD}$). Accordingly, the output of the inverter 120, i.e., the output OUT of the timer circuit 100, is low.

When the current $I_4$ exceeds the current $I_2$ ($I_4 > I_2$) at the time point $t_3$, the voltage $V_{INV}$ of the input node 122 of the inverter 120 is set to low (0 V). In this state, the output of the inverter 120, i.e., the output OUT of the timer circuit 100 transits to high.

The time between the time points $t_0$ and $t_2$ is used as the measurement time $\tau_{MEAS}$ by the timer circuit 100. The capacitor voltage $V_{C1(TH)}$ at the time point $t_2$ is represented by $V_{C1(TH)} = I_2 \times R1/K + V_{C1(TH)}$.

Directing attention to the capacitor C1, the capacitor voltage $V_{C1}$ is generated by charging the capacitor C1 using a charging current $I_{CHG} = I_1 - I_3$. Accordingly, the integration time $\tau$ represented by $C1 \times (I_2 \times R1/K + V_{C1(TH)}) = \int I_{CHG}(t) \, dt$ is the measurement time $\tau_{MEAS}$.

The above is the operation of the timer circuit 100. The advantages of the timer circuit 100 can be clearly understood in comparison with conventional techniques.

Figure 3:
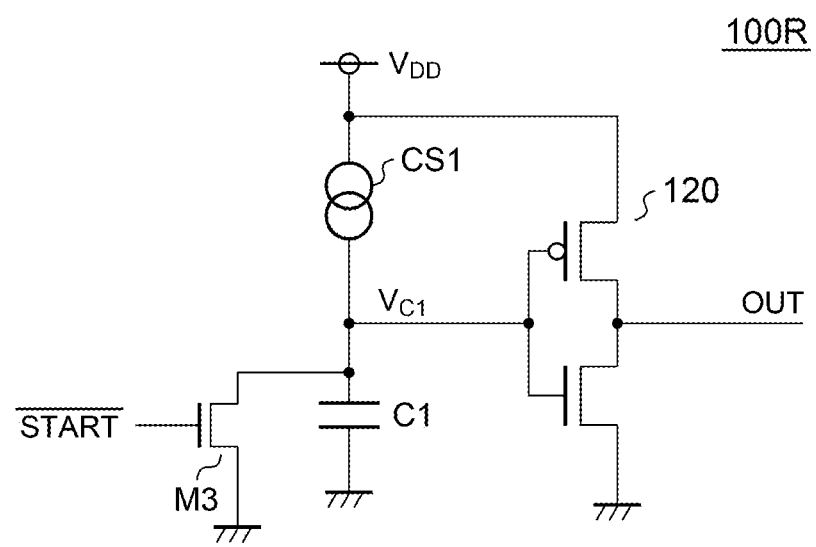
FIG. 3 is a circuit diagram of a timer circuit according to a comparison technique.

FIG. 3 is a circuit diagram of a timer circuit 100R according to a comparison technique. The timer circuit 100R includes a capacitor C1, a first current source CS1, a reset transistor M3, and an inverter 120.

The capacitor C1 is charged by the current $I_1$ generated by the current source CS1. The capacitor voltage $V_{C1}$ increases with a constant slope with time. With this, when the capacitor voltage $V_{C1}$ reaches the threshold voltage of the inverter 120, the output OUT changes from high to low.

In this case, the threshold voltage of the inverter 120 is half the power supply voltage $V_{DD}$. Accordingly, with the timer circuit 100R shown in FIG. 3, a change of the power supply voltage $V_{DD}$ leads to a change of the measurement time $\tau_{MEAS}$.

In contrast, the timer circuit 100 shown in FIG. 1 has an advantage that the measurement time $\tau_{MEAS}$ does not depend on the power supply voltage $V_{DD}$.

Next, description will be made regarding the usage of the timer circuit 100. The timer circuit 100 can be used in an oscillator circuit.

Figure 4:
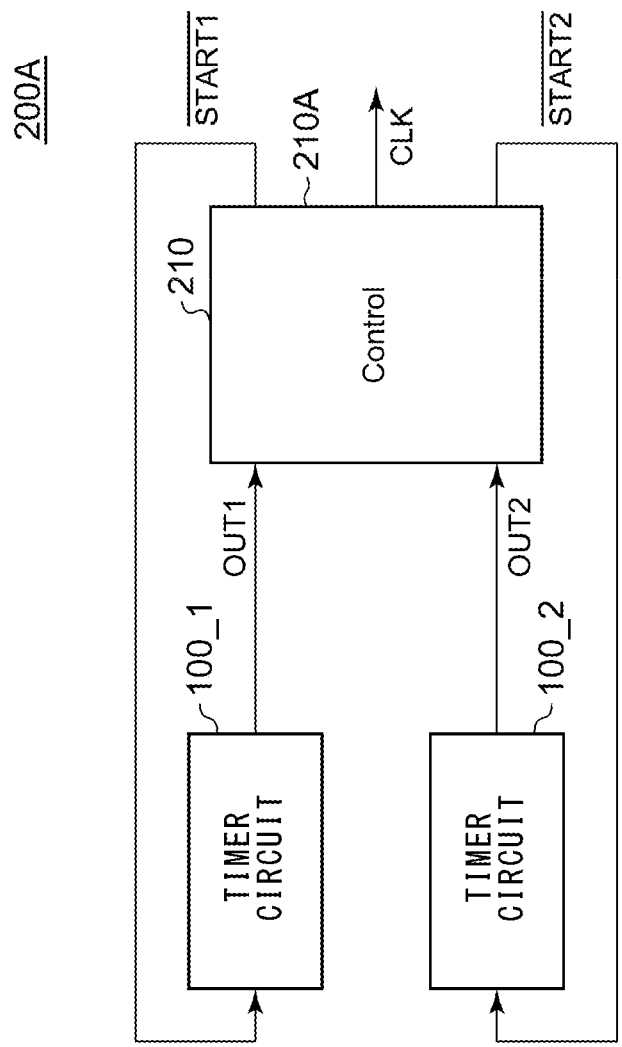
FIG. 4 is a circuit diagram of an oscillator according to an embodiment.

FIG. 4 is a circuit diagram of an oscillator 200A according to an embodiment. The oscillator 200A includes a first timer circuit 100_1, a second timer circuit 100_2, and a controller circuit 210.

The first timer circuit 100_1 and the second timer circuit 100_2 each have the same configuration as that of the timer circuit 100 described above. The respective measurement times $\tau_{MEAS1}$ and $\tau_{MEAS2}$ of the first timer circuit 100_1 and the second timer circuit 100_2 may be the same or may be different.

The controller circuit 210 asserts a second start signal /START2 for the second timer circuit 100_2 in response to the assertion of an output OUT1 of the first timer circuit 100_1. Furthermore, the controller circuit 210 asserts a first start signal /START1 for the first timer circuit 100_1 in response to the assertion of an output OUT2 of the second timer circuit 100_2. During a period in which one of the first start signal /START1 and the second start signal /START2 is asserted, an output CLK of the controller 210 is set to a first level (e.g., high). During a period in which the other is asserted, the output CLK of the controller 210 is set to a second level (e.g., low).

Figure 5:
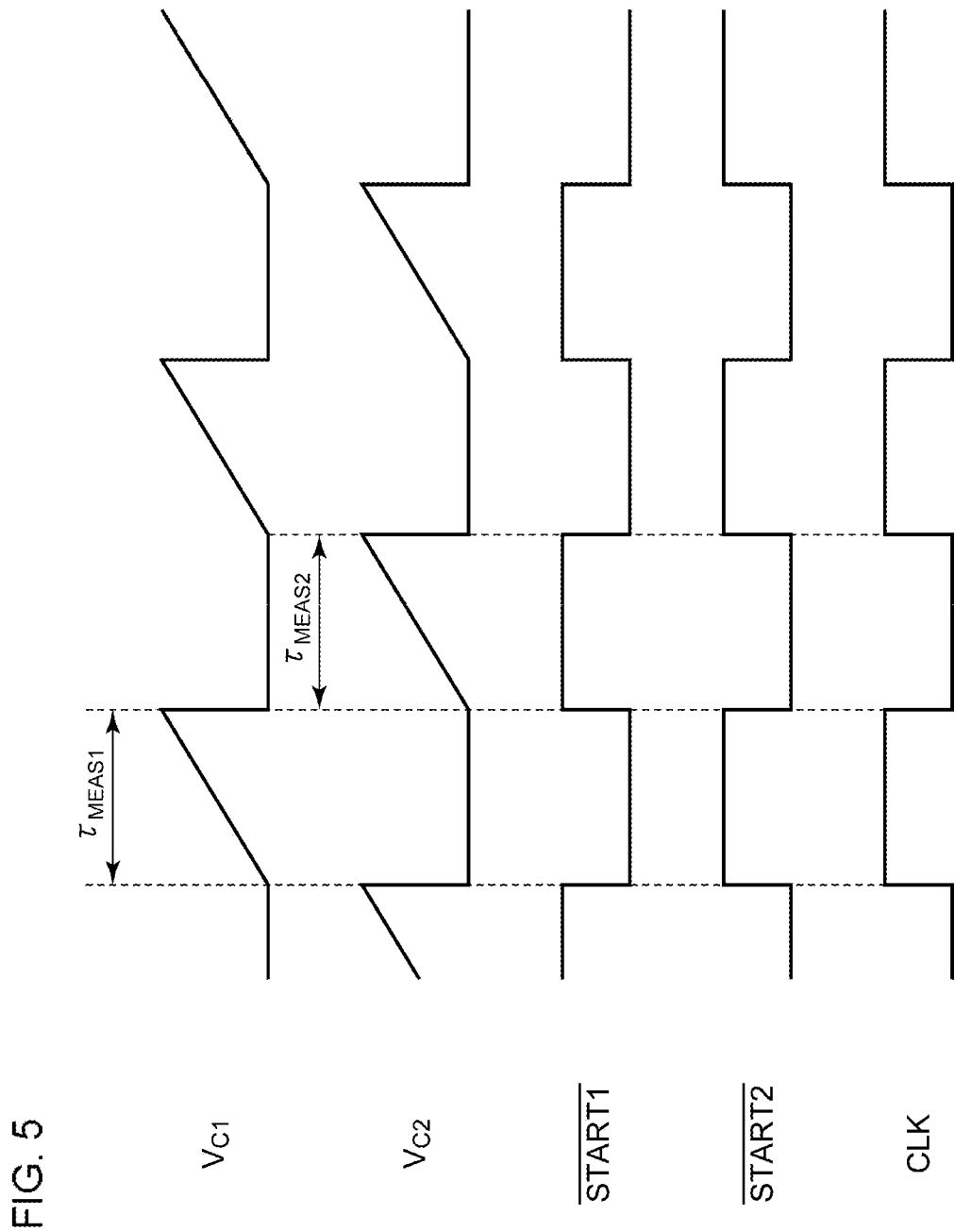
FIG. 5 is an operation waveform diagram of the oscillator shown in FIG. 4.

FIG. 5 is an operation waveform diagram of the oscillator 200A shown in FIG. 4. In the oscillator 200A, the first timer circuit 100_1 and the second timer circuit 100_2 are alternately activated. The oscillator 200A generates the clock signal CLK having a period represented by the sum of the two measurement times ($\tau_{MEAS1} + \tau_{MEAS2}$).

Next, description will be made regarding the temperature characteristics of the timer circuit 100. The measurement time $\tau_{MEAS}$ of the timer circuit 100 is affected by the temperature characteristics of the current mirror circuit 110.

Figure 6:
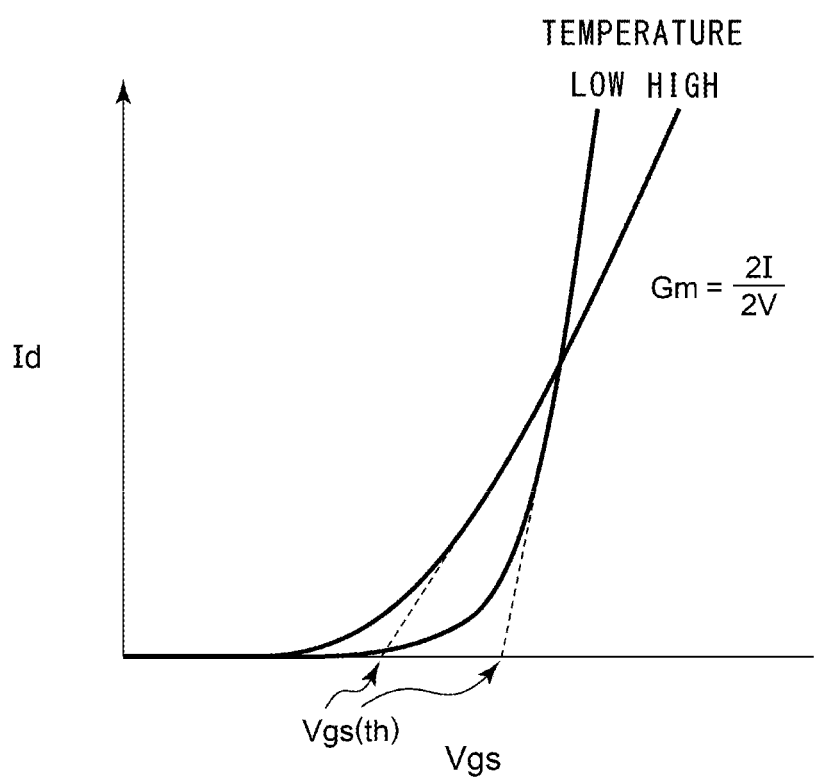
FIG. 6 is a schematic diagram for explaining the temperature characteristics of a MOSFET.

FIG. 6 is a schematic diagram for explaining the temperature characteristics of a MOSFET. FIG. 6 shows the voltage-current characteristics at two temperatures, i.e., a high temperature and a low temperature. Description will be made assuming that the gate and the drain of the MOSFET are coupled, and the gate-source voltage Vgs is equal to the gate-drain voltage Vds. The horizontal axis represents the gate-source voltage Vgs, and the vertical axis represents the drain current Id.

A MOSFET has the following characteristics.
(i) As the temperature becomes higher, the gate-source threshold voltage $V_{GS(th)}$ of the MOSFET becomes lower, leading to the drain current readily flowing. In FIG. 6, $V_{GS(th)}$ is shown as a voltage determined using the Gmmax method.
(ii) As the temperature becomes higher, the conductance Gm of the MOSFET, i.e., the slope of the drain current Id with respect to the gate voltage Vgs (dId/dVgs) becomes smaller.

Accordingly, the operating point of the input-side transistor M11 of the current mirror circuit 110 (gate-source voltage, i.e., the gate-drain voltage, i.e., the voltage at the input node 112 of the current mirror circuit 110) may preferably be determined. Furthermore, the ratio between the channel width W and the channel length L of the input-side transistor M11, i.e., W/L, may preferably be determined such that the temperature characteristics described in (i) and the temperature characteristics described in (ii) cancel each other out.

For example, this allows the gate-source voltage Vgs of the input-side transistor at a time point when the output of the inverter 120 changes to be controlled within fluctuation of 0.1 V or less, and more preferably, 0.05 V or less, when the temperature changes within the guaranteed operating temperature range.

Figure 7:
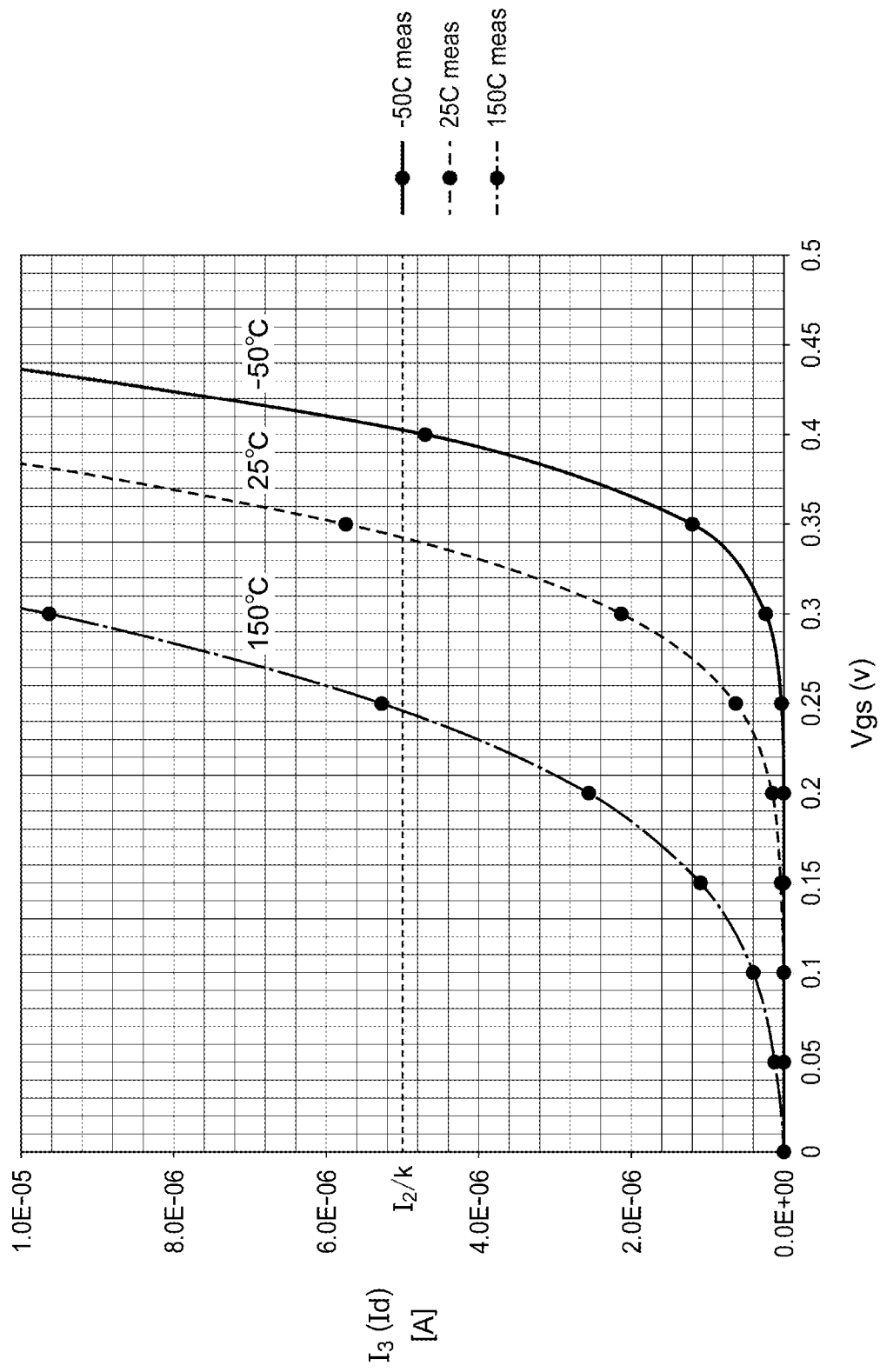
FIG. 7 is a diagram showing the voltage-current characteristics of an input-side transistor in a case in which the input-side transistor has an unsuitable size.

FIG. 7 is a diagram showing the voltage-current characteristics of the input-side transistor M11 in a case in which the input-side transistor M11 has an unsuitable size. The operating point (i.e., the point at which the output of the inverter 120 changes) is $I_3$=5 μA. The input-side transistor M11 has a size of W/L=10 μm/1 μm. In a case in which the input-side transistor M11 has an unsuitable size as described above, when the temperature changes in the order of −50° C., 25° C., and 150° C., the gate-source voltage Vgs at the operating point fluctuates in a range on the order of 0.4 V, which is wider than 0.1 V.

Figure 8:
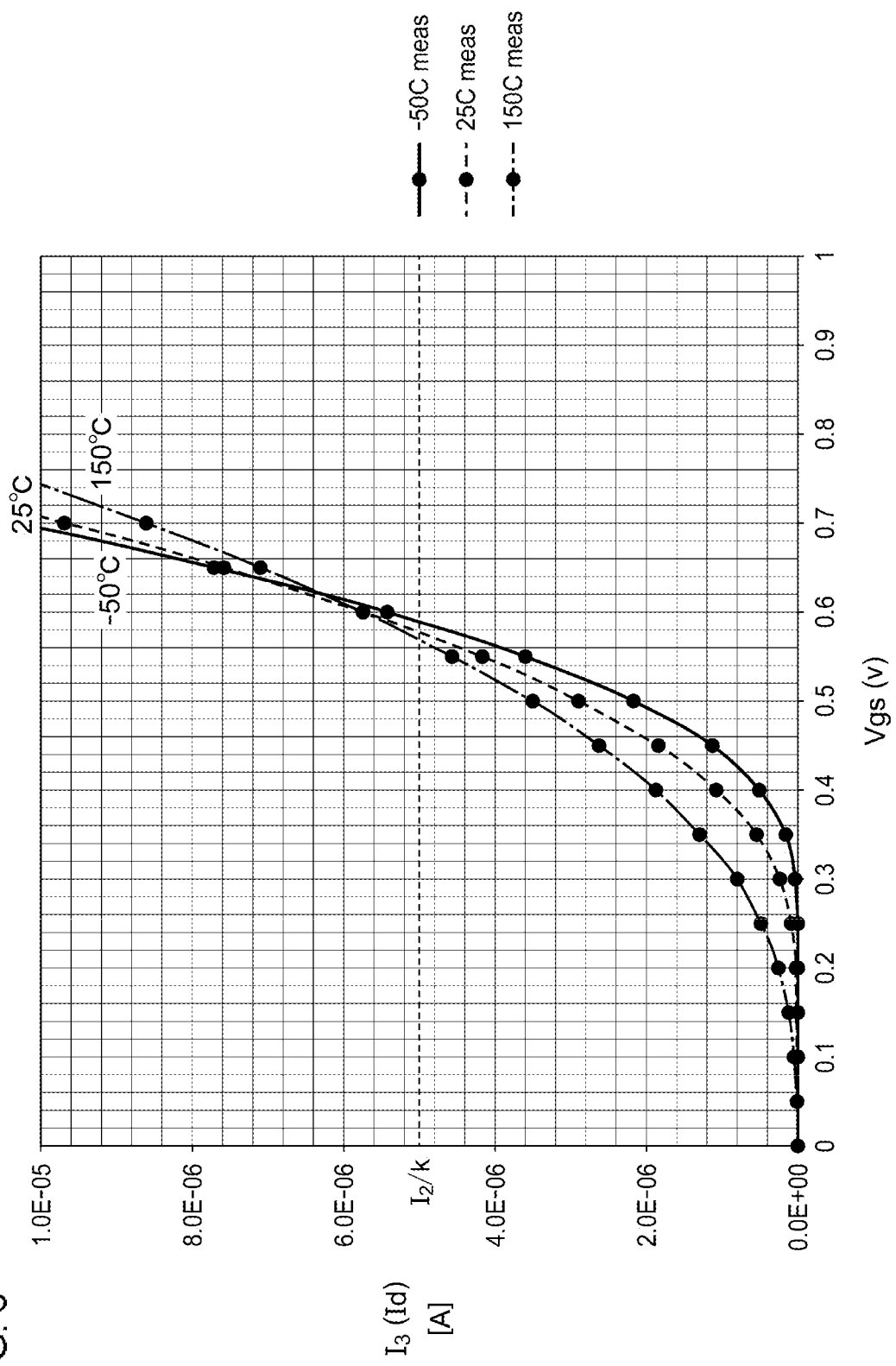
FIG. 8 is a diagram showing the voltage-current characteristics of the input-side transistor having an optimized size.

FIG. 8 is a diagram showing the voltage-current characteristics of the input-side transistor M11 having an optimized size. The operating point is $I_3$=5 μA. The input-side transistor M11 has a size of W/L=10 μm/10 μm. In a case in which the input-side transistor M11 has such an optimized size as described above, when the temperature changes in the order of −50° C., 25° C., and 150° C., such an arrangement is capable of controlling the fluctuation of the gate-source voltage Vgs at the operating point in a range of 0.1 V, and specifically, in a range that is narrower than 0.05 V.

Figure 9:
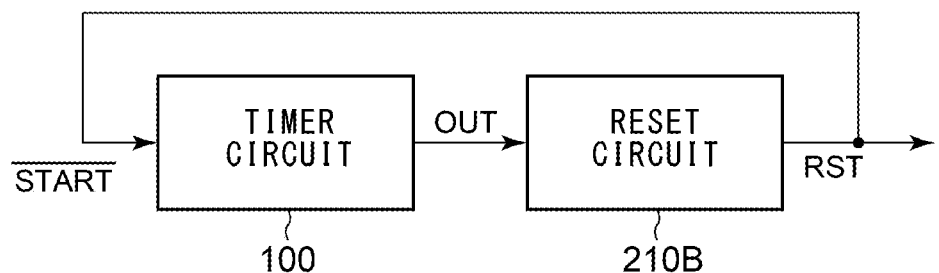
FIG. 9 is a circuit diagram of an oscillator according to a modification.

FIG. 9 is a circuit diagram of an oscillator 200B according to a modification. The oscillator 200B includes the timer circuit 100 described above and a reset circuit 210B. The reset circuit 210B is configured as a one-shot circuit, for example. The reset circuit 210B generates a reset pulse RST having a predetermined pulse width $T_{ON}$ with the assertion (e.g., high level) of the output OUT of the timer circuit 100 as a trigger. The reset pulse RST is input to the timer circuit 100 as a start signal /START.

Figure 10:
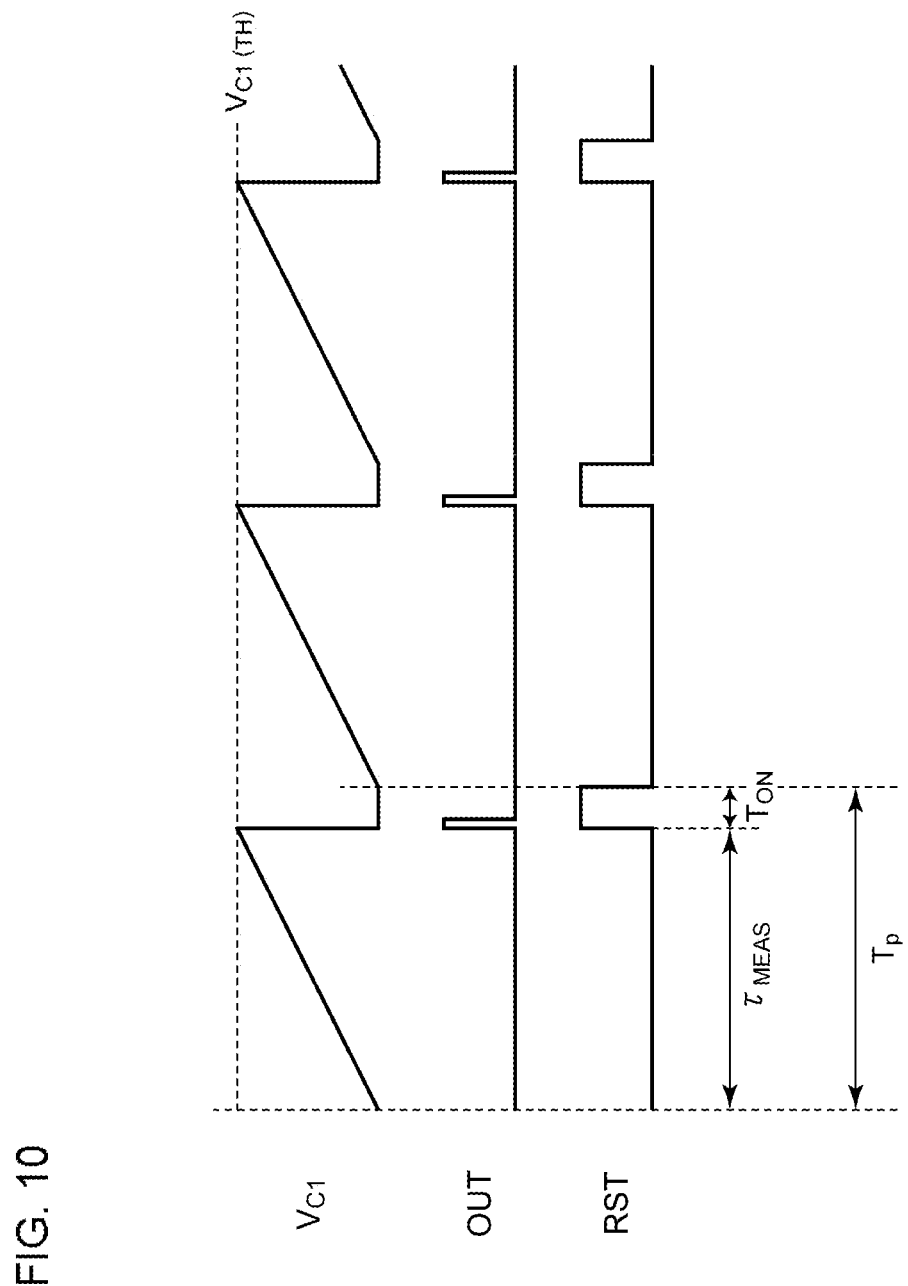
FIG. 10 is an operation waveform diagram of the oscillator shown in FIG. 9.

FIG. 10 is an operation waveform diagram of the oscillator 200B shown in FIG. 9. The reset pulse RST has a period Tp that is the sum of the measurement time $\tau_{MEAS}$ of the timer circuit 100 and the pulse width $T_{ON}$ of the reset pulse RST.

It should be noted that the configuration of the oscillator 200 using the timer circuit 100 is not restricted to an arrangement shown in FIG. 4 or FIG. 9. Next, description will be made regarding the usage of the oscillator 200 using the timer circuit 100.

Figure 11:
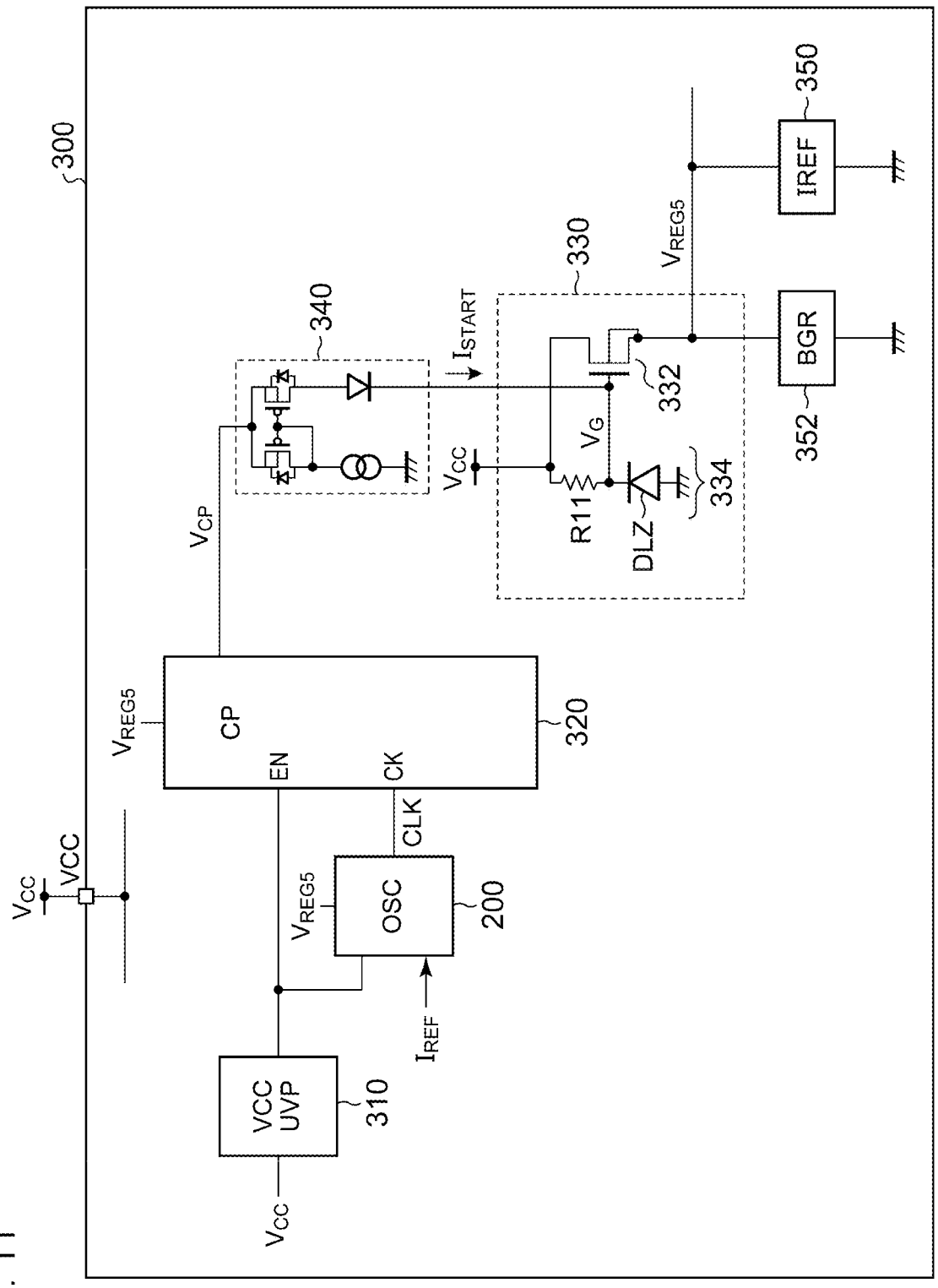
FIG. 11 is a circuit diagram of a semiconductor apparatus including an oscillator.

FIG. 11 is a circuit diagram of a semiconductor apparatus 300 including the oscillator 200. The semiconductor apparatus 300 includes an under voltage protection (UVP) circuit 310, a charge pump circuit 320, a regulator circuit 330, a startup bias circuit 340, a reference current source 350, a bandgap reference circuit 352, and so forth.

An external power supply voltage $V_{CC}$ is supplied from an external power supply circuit to a power supply terminal VCC of the semiconductor apparatus 300. The regulator circuit 330 receives the external power supply voltage $V_{CC}$ as an input voltage and generates an internal power supply voltage $V_{REG5}$ stabilized to a predetermined target level (e.g., 5 V). The internal power supply voltage $V_{REG5}$ is supplied to load circuits such as the reference current source 350, the bandgap reference circuit 352, etc.

The regulator circuit 330 is configured as a source follower circuit including an NMOS transistor 332 and a bias circuit 334. The bias circuit 334 includes a Zener diode DLZ and a resistor R11. The bias circuit 334 generates a Zener voltage Vz of the Zener diode DLZ at the gate of the NMOS transistor 332. The internal power supply voltage $V_{REG5}$ is stabilized to a target level represented by $V_{REF(REF)} = V_Z - V_{GS}$. Here, $V_{GS}$ represents the gate-source voltage of the NMOS transistor 332. For example, the Zener voltage Vz is determined such that $V_{REF(REF)}$=5 V holds true.

When the external power supply voltage $V_{CC}$ is lower than the target level (5 V) of the internal power supply voltage $V_{REG5}$, i.e., the Zener voltage Vz of the Zener diode DLZ, the bias circuit 334 is not able to operate. In order to appropriately bias the NMOS transistor 332 in this state, the UVP circuit 310, the oscillator 200, and the charge pump circuit 320 are provided.

The UVP circuit 310 compares the external power supply voltage $V_{CC}$ with an under voltage threshold value $V_{UVP}$. When $V_{CC} < V_{UVP}$ holds true, the UVP circuit 310 asserts (e.g., sets to high) the UVP signal.

When the UVP signal is asserted, the oscillator 200 transits to the operating state. In this state, the oscillator 200 generates a clock signal CLK. Furthermore, the UVP signal is supplied to an enable terminal of the charge pump circuit 320. When the UVP signal is asserted, the charge pump circuit 320 transits to the enable state. In this state, the charge pump circuit 320 boosts the internal power supply voltage $V_{REG5}$ in synchronization with the clock signal CLK, so as to generate the charge pump voltage $V_{CP}$. The charge pump voltage $V_{CP}$ is higher than the target level of the internal power supply voltage $V_{REG5}$.

The startup bias circuit 340 operates with the charge pump voltage $V_{CP}$ as a power supply. The startup bias circuit 340 functions as a source of the startup current $I_{START}$ to the gate of the NMOS transistor 332. With such an arrangement in which the startup current $I_{START}$ flows through the Zenner diode DLZ, this is capable of generating the Zenner voltage Vz at the gate of the NMOS transistor 332 even in a state in which the external power supply voltage $V_{CC}$ is low.

With such an arrangement in which the oscillator 200 for supplying the clock signal CLK to the charge pump circuit 320 is configured using the timer circuit 100 according to the present embodiment, this is capable of generating the clock signal CLK with a stable frequency.

MODIFICATIONS

Description has been made in the embodiment regarding an arrangement in which the current mirror circuit 110 is configured using MOSFETs. However, the current mirror circuit 110 may be configured using bipolar transistors. The circuit blocks other than the current mirror circuit 110, e.g., the inverter 120, reset transistor M3, first current source CS1, second current source CS2, or the like, may be configured using bipolar transistors.

Description has been made regarding the present invention with reference to the embodiments using specific terms. However, the above-described embodiments show only an aspect of the mechanisms and applications of the present invention. Rather, various modifications and various changes in the layout can be made without departing from the spirit and scope of the present invention defined in appended claims.

What is claimed is:

1. A timer circuit comprising:
    a capacitor;
    a first current source structured to charge the capacitor;
    an inverter;
    a second current source structured to supply a current to an input node of the inverter;
    a current mirror circuit having an output node coupled to the input node of the inverter; and
    a resistor coupled between an input node of the current mirror circuit and the capacitor.

2. The timer circuit according to claim 1, wherein the current mirror circuit is configured using a field-effect transistor.

3. The timer circuit according to claim 2, wherein a ratio between a channel width W and a channel length L, i.e., W/L, is determined such that, when an output of the inverter changes, a fluctuation of a gate-source voltage of an input-side transistor of the current mirror circuit is maintained within a range of 0.05 V or less in a case in which a fluctuation occurs in a temperature within a guaranteed operating temperature range.

4. The timer circuit according to claim 1, wherein the current mirror circuit is configured using a bipolar transistor.

5. The timer circuit according to claim 1, monolithically integrated on a single semiconductor substrate.

6. An oscillator circuit comprising two timer circuits according to claim 1, wherein each of the two timer circuits is reset by an output of the other timer circuit.

7. An oscillator circuit comprising:
    the timer circuit according to claim 1; and
    a reset circuit structured to discharge the capacitor in response to an output of the inverter of the timer circuit.

8. A semiconductor apparatus comprising:
    the oscillator circuit according to claim 6;
    a charge pump circuit structured to be driven according to an output signal of the oscillator circuit;
    a linear regulator including an NMOS transistor; and
    a startup bias circuit structured to receive an output voltage of the charge pump circuit, and to generate a bias voltage at a gate of the NMOS transistor.

9. A semiconductor apparatus comprising:
    the oscillator circuit according to claim 7;
    a charge pump circuit structured to be driven according to an output signal of the oscillator circuit;
    a linear regulator including an NMOS transistor; and
    a startup bias circuit structured to receive an output voltage of the charge pump circuit, and to generate a bias voltage at a gate of the NMOS transistor.

* * * * *